(12) United States Patent
Chen et al.

(10) Patent No.: US 11,133,043 B2
(45) Date of Patent: Sep. 28, 2021

(54) CONFIGURABLE CONTROL OF INTEGRATED CIRCUITS

(71) Applicant: Arm Limited, Cambridge (GB)

(72) Inventors: Andy Wangkun Chen, Austin, TX (US); Yew Keong Chong, Austin, TX (US); Sriram Thyagarajan, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/783,104

(22) Filed: Feb. 5, 2020

(65) Prior Publication Data

US 2021/0241807 A1    Aug. 5, 2021

(51) Int. Cl.
| | |
|---|---|
| *G11C 8/00* | (2006.01) |
| *G11C 8/10* | (2006.01) |
| *G11C 7/06* | (2006.01) |
| *G11C 7/22* | (2006.01) |
| *G11C 7/10* | (2006.01) |
| *G11C 7/12* | (2006.01) |

(52) U.S. Cl.
CPC ............... *G11C 8/10* (2013.01); *G11C 7/06* (2013.01); *G11C 7/106* (2013.01); *G11C 7/1087* (2013.01); *G11C 7/12* (2013.01); *G11C 7/22* (2013.01)

(58) Field of Classification Search
CPC .. G11C 8/10; G11C 7/06; G11C 7/106; G11C 7/1087; G11C 7/12; G11C 7/22
USPC ...................................................... 365/230.06
See application file for complete search history.

(56) References Cited

U.S. PATENT DOCUMENTS

| | | | |
|---|---|---|---|
| 2009/0316512 A1* | 12/2009 | Terzioglu | ................. G11C 7/06 365/230.03 |
| 2018/0166128 A1* | 6/2018 | Rawat | ................... G11C 11/418 |
| 2020/0020700 A1* | 1/2020 | Lin | ................. H01L 21/823892 |

* cited by examiner

*Primary Examiner* — Xiaochun L Chen
(74) *Attorney, Agent, or Firm* — Pramudji Law Group PLLC; Ari Pramudji

(57) ABSTRACT

According to one implementation of the present disclosure, an integrated circuit includes first and second word-line decoder circuitry; one or more core arrays, respective input/output (I/O) circuitry for each of the one or more core arrays, and control circuitry coupled to the first and second word-line decoder circuitries, the one or more core arrays, and the respective I/O circuitries. Also, one or more control signals, activated from one or more control signals generated in the control circuitry, may be configured to select corresponding one or more core arrays of the one or more core arrays.

20 Claims, 11 Drawing Sheets

CONFIGURABLE CONTROL OF INTEGRATED CIRCUITS

I. FIELD

The present disclosure is generally related to the configurable control of integrated circuit devices.

II. DESCRIPTION OF RELATED ART

Advances in technology have resulted in smaller and more powerful computing devices. For example, a variety of personal computing devices, including wireless telephones, such as mobile and smart phones, gaming consoles, tablets and laptop computers are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing and networking capabilities. For such devices, there is an ever-increasing demand for greater efficiency in power, performance, and area (PPA) for memory storage capacity and read/write capabilities. In one instance, for graphics processing units (GPU), there is an ongoing need in the art reduce power supply voltage during various computing operations.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

Figure 1:
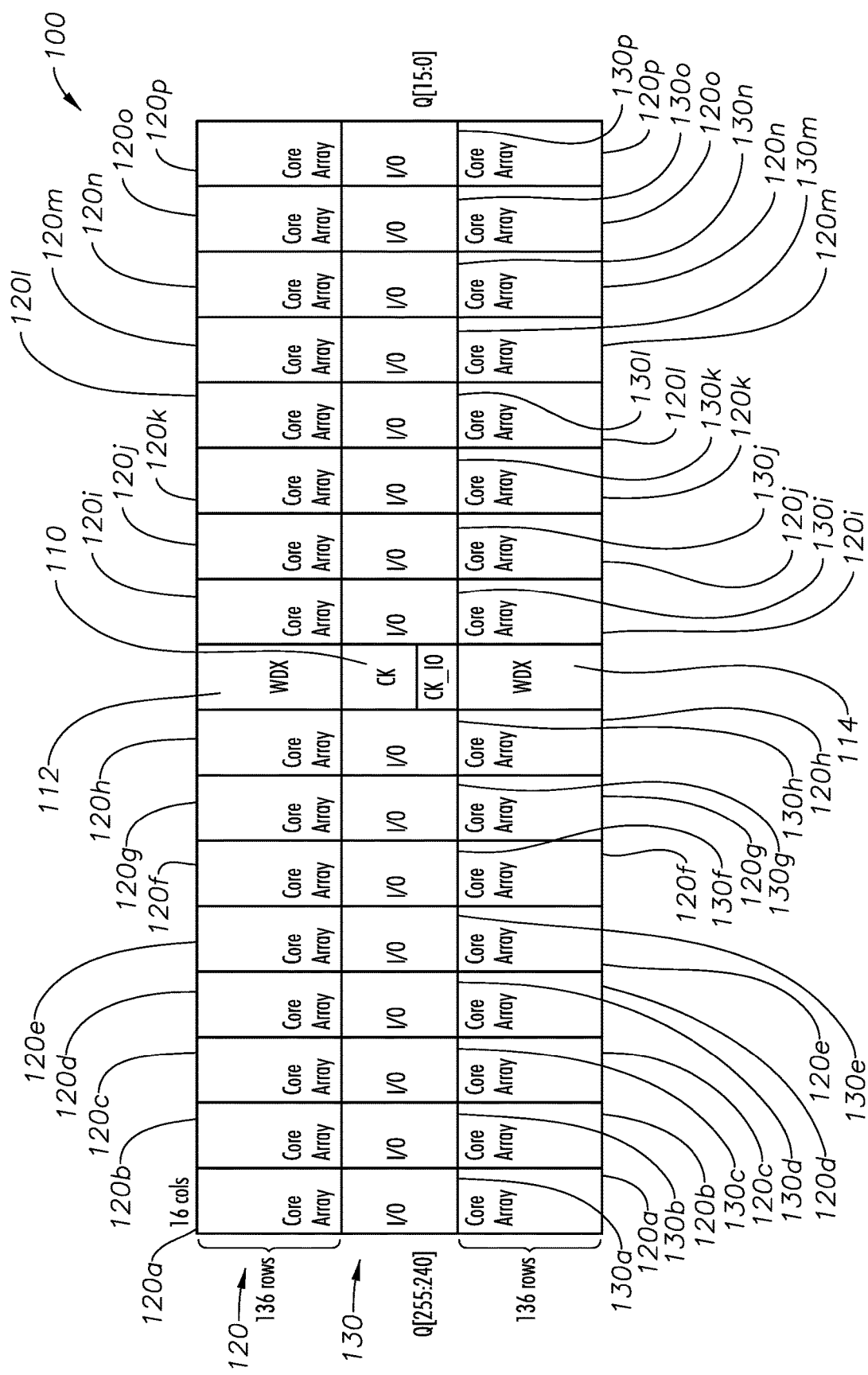
FIG. 1 is a schematic diagram of a portion of an example integrated circuit in accordance with various implementations described herein.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

IV. DETAILED DESCRIPTION

Particular implementations of the present disclosure are described below with reference to the drawings. In the description, common features are designated by common reference numbers throughout the drawings.

Advantageously, certain inventive aspects of the present invention allow for power, performance, area (PPA) optimized memory configurations of integrated circuits such as graphics processing units (GPU). More specifically, in certain cases, the integrated circuits may be a 272-word×256 bit-cell Turse Execution Engine General Purpose Register File RAM (EE-GPRF-RAM). In other cases, the integrated circuits may be other memory types and/or be of any size, including, of greater size (e.g., 512, 1024, 2048 bit-cells per row etc. or more than 272 rows or smaller size (e.g., 128, 64, 32, 16, 8 bit-cells per row etc. or less than 272 rows).

Accordingly, in certain schemes and techniques, as described herein, the inventive aspects allow for the capacity of a "butterfly" EE-GPRF-RAM core array structure to be customized (through circuit schematics in the control block and/or input/output circuitries) to control (e.g., to activate for read operation) any sub-portion (i.e., column groupings, segments) of the memory core arrays per execution cycle. In certain implementations, the sub-portions may be of any granularity including: 128, 64 (as discussed with reference to FIGS. 5 and 6A-6C), 32 (as discussed with reference to FIGS. 3 and 4A-4C), 16 (as discussed with reference to FIGS. 1 and 2A-2C), 8, 4, or 2 bit-cell sub-portions. In other schemes and techniques, the inventive aspects can also be implemented in any other core array structure. Hence, such schemes and techniques are not limited to "butterfly" core arrays or RAM core arrays.

Moreover, the inventive aspects allow for further selection customization (e.g., read capacity) through the capability to select specific bit-cell sub-portions or any number of consecutive or non-consecutive individual bit-cells. In various instances, this may be accomplished through the inclusion of an additional circuit read mask schematic (e.g., such as described with reference to each of FIGS. 7, 8, and 9A-9B) implemented in each input/output circuitries of an example integrated circuit. Additionally, with further reference to FIGS. 7, 8, and 9A-9B, the inventive aspects allow for the control and selection of specific bit-cells by each individual I/O circuitry of the integrated circuit.

Figure 2A:
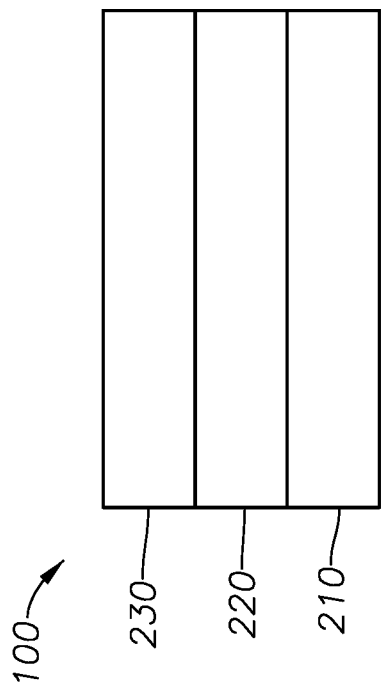
FIG. 2A is block diagram of certain layers of the example integrated circuit of FIG. 1 in accordance with various implementations described herein.
Figure 2C:
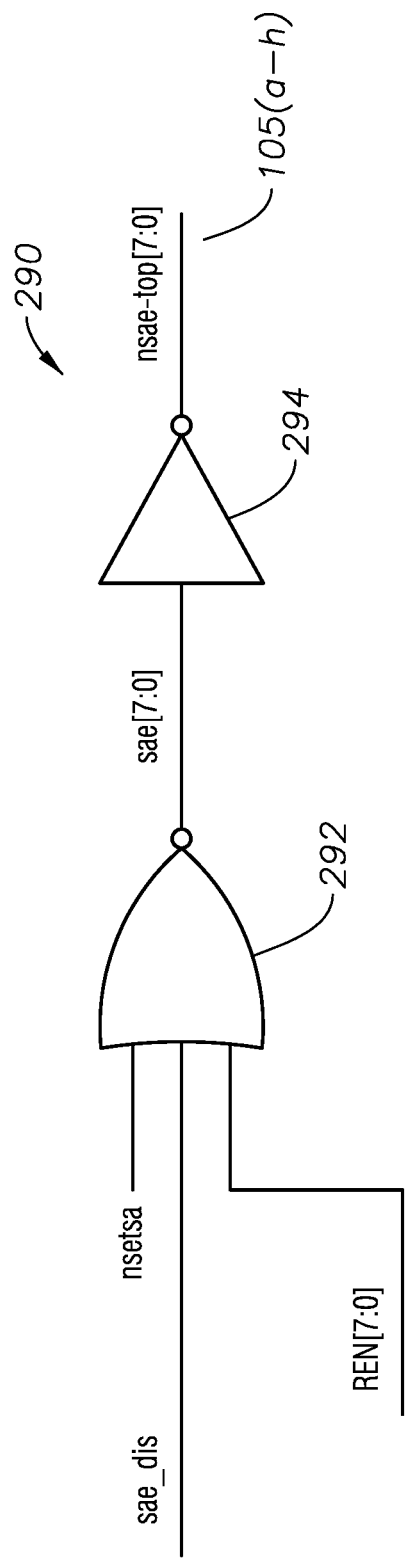
FIG. 2C is a schematic diagram of a circuit in accordance with various implementations described herein.
Figure 2B:
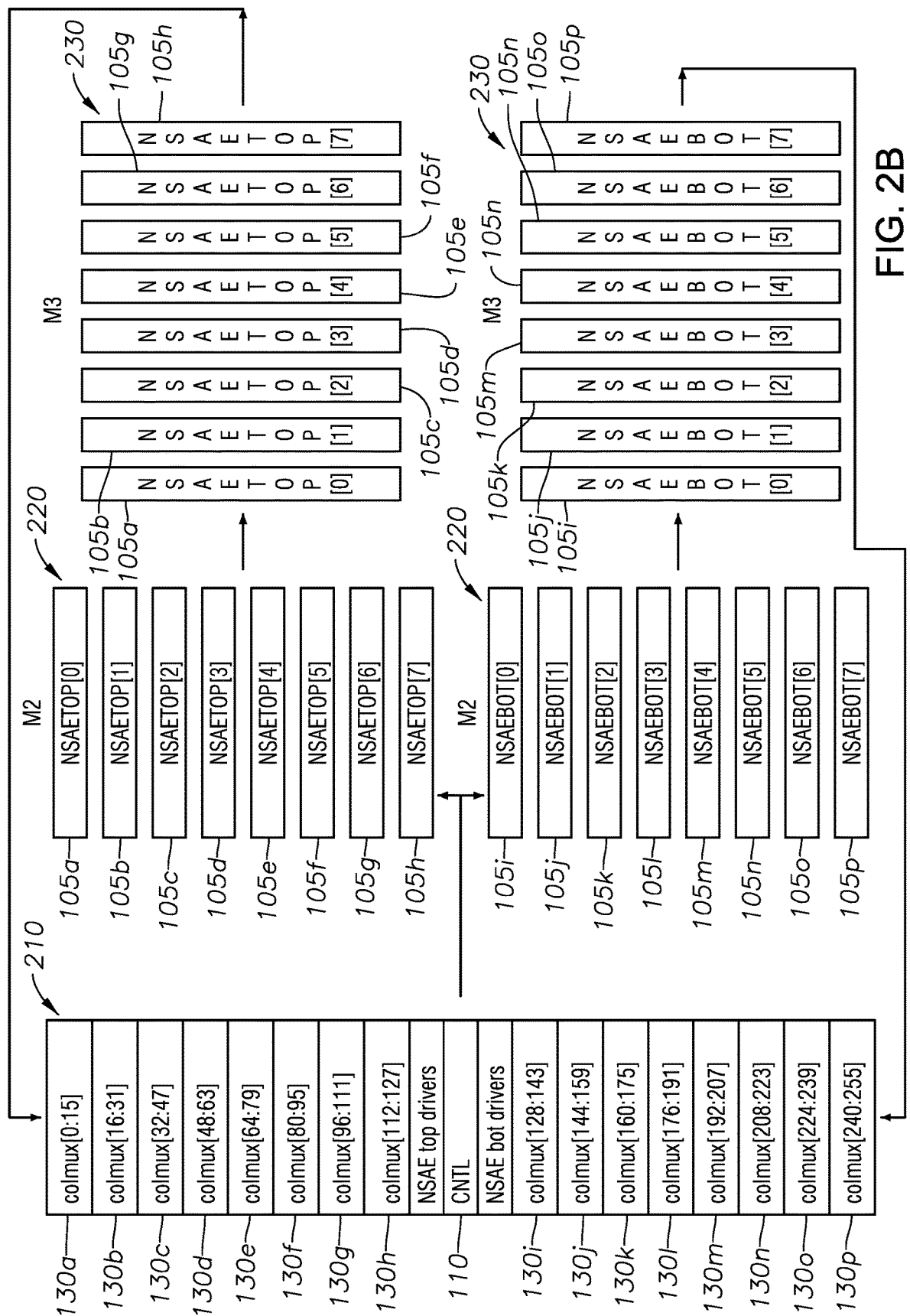
FIG. 2B is a detailed block diagram of the layers of FIG. 2A in accordance with various implementations described herein.

Referring to FIGS. 1 and 2A-2B, example portions of an integrated circuit 100 (e.g., a Turse Execution-Engine (EE) General Purpose Register File random access memory (EE-GPRF-RAM), a "butterfly architecture" implementable on a system-on-chip (SoC)) are shown. As depicted in FIG. 1, the example portion (e.g., core array structure, "floor plan") may include: a control circuitry (i.e., a central block) ("CK") 110, first and second word-line decoder circuitries 112, 114, one or more core arrays 120 (e.g., 120a, 120b, etc.), and respective input/output circuitry (I/O circuitry) 130. In certain implementations, the control circuitry 110 may be coupled to the first and second word-line decoder circuitries 112, 114, the one or more core arrays 120, and the respective input/output circuitries 130. Also, one or more control signals 105 (e.g., 105a-105p) (i.e., a sense amplifier driver signal(s), read mask signal(s)), activated from one or more control signals (e.g., sense amplifier enable signals (NSAE)) generated in the control circuitry 110, may be configured to select one or more corresponding core arrays of the one or more core arrays 120 (e.g., 120a-120p) (e.g., 120a (e.g., for both the above 136 rows and the below 136 rows) corresponding to a first core array, 120b (e.g., for both the above 136 rows and the below 136 rows) corresponding to a second core array, etc.) (i.e., to provide independent control of each individual core array (e.g., 120a-120p) (e.g., core groupings).

As shown in FIG. 1, the example EE-GPRF-RAM memory may be of 272 memory words×256 bits (bit-cells) per row. For instance, as illustrated, the example 256 bits per row may be organized as 16 columns, where 8 columns are located on a first side (e.g., a "left" side of the control circuitry 110) and 8 columns are located on a second side (e.g., a "right" side of the control circuitry 110). Correspondingly, with reference to FIG. 1, the one or more core arrays 120 (e.g., 120a (e.g., for both the above 136 rows and the below 136 rows), 120b (e.g., for both the above 136 rows and the below 136 rows), etc.) may be organized as a first grouping of eight memory columns 120a, 120b, 120c, 120d, 120e, 120f, 120g, 120h (i.e., memory "chunks", modules, segments, a plurality of core arrays) on the first side and a second grouping of eight memory columns 120i, 120j, 120k, 120l, 120m, 120n, 120o, 120p on the second side. Hence, in this example, each of the 16 columns may include 16-bit groupings (i.e., 16-bit-cell per grouping) for a total of 256 bits. Nevertheless, in other examples, where the total number of bit-cells per row is different (either a greater number or lesser number of bit-cells per row), the number of bit-cells per grouping would be different so as to evenly be organized as 16 columns.

Advantageously, in FIG. 1, the one or more control signals 105 (e.g., 105a-105p) can allow for the capacity to "turn on" (i.e., activate) (e.g., enable read operation (i.e., the read-mask feature)) of 16-bit groupings at a time (i.e., in one read cycle). In contrast, in a memory without such a read-mask feature, during a read operation, all 256-bits (of the row), for example, of the integrated circuit 100 would be read for the same cycle. Hence, power would be "wasted" (put to inefficient use) for 240 bits (of the row). Thus, the inventive aspects allow for the capacity to read 16-bits (bit-cells) (or multiples thereof by activating multiple control signals) in a signal operation cycle. By doing so, as realized through a memory dynamic power breakdown comparison, such read-mask features may save up to 65% of clock power utilization. Moreover, additional power savings may be realized in memory output pin power and system-on-chip (SoC) buffers and wires power.

In certain implementations, with reference to FIG. 1, each of the 16 core array groupings (120a-120p) may be coupled to respective input/output circuitry (I/O circuitry) 130 (130a-130p). Each of the I/O circuitry 130 may include sense amplifier driver circuitry, pre-charge circuitry, a column multiplexer, and input and output latches. Moreover, each of the sense amplifier driver circuitry may include a sense amplifier circuit and write driver circuitry.

In certain aspects, each of the first and second word-line decoder blocks (circuitries) 112, 114 may include a word-line post decoder and driver circuits. In a particular case, the word-line decoder blocks (circuitries) 112, 114 may be configured to select word-lines coupled to the one or more core arrays 120 (120a, 120b, etc.) based on the one or more control signals 105 (e.g., 105a-105h) generated by the control block 110.

Referring to FIG. 2A, example "layers" of the integrated circuit 100 are shown. As illustrated, the example layers are provided to depict the general positioning of the layers with respect to one another and have not been drawn to scale or to provide an accurate graphical representation of the particular layers. Correspondingly, in FIG. 2A, the example layers include a layout configuration layer 210 (i.e., a column multiplexer layer), a first metal layer 220 (e.g., an M2 metal layer), and a second metal layer 230 (e.g., an M3 metal layer). In certain implementations, the first metal layer 220 may be coupled and positioned above the layout configuration layer 210, and the second metal layer 230 may be coupled and positioned above the first metal layer 220.

Referring to FIG. 2B, each of the three layers 210, 220, 230 of the integrated circuit 100 of FIG. 2A are shown in greater detail. As illustrated, with reference to FIG. 1, the example layers can be provided to generally depict the specific one or more control signals 105 (e.g., 105a-105h) of the one or more control signals (e.g., sense amplifier enable signals (NSAE)) that can be activated. In this instance, up to 16 control signals (i.e., 16 NSAE signals (nsae-top[7:0] and nsae-bot[7:0]) 105 (105a-105p) can be activated at a given time (in one cycle) to control respective core arrays 120 (120a-120p) (i.e., 16-bit modules (groupings, segments)) (where, for example, each 16-bit module includes 16 bit-cells).

In operation, as illustrated with reference to FIG. 2B, initially, the control circuitry (CK) 110 may transmit the one or more control signals 105 (105a-105p). The one or more control signals 105 (105a-105p) would be sent from the control block 110 on the layout configuration layer 210, "up" through the first metal layer 220, and further "up" to the second metal layer 230. Subsequently, the control signals 105 (105a-105p) would be sent "down" from the second metal layer 230, through the first metal layer 220, and received to a particular specified I/O circuitry 130 (e.g., 130a-130p) corresponding to the specific bit-cell grouping (e.g., 120a-120p) to be activated.

As illustrated in FIG. 2B, the first metal layer 220 (e.g., the M2 layer) and the second metal layer 230 may each receive 8 control signals 105 (i.e., 105a-105h) (e.g., NSAETOP[0] to NSAETOP[7]) and 8 control signals 105 (i.e., 105i-105p) (e.g., NSAEBOT[0] to NSAEBOT[7]) from the control circuit 110 to be transmitted to respective column multiplexers ([0:15], [16:31], [32:47], [16:31], [48:63], [64:79], [80:95], [96:111], [112:127], [128:143], [144:159], [160:175], [176:191], [192:207], [208:223], [224:239], and [240:255]) of the respective I/O circuitries 130 (130a-p). Next, from the respective I/O circuitries 130, the one or more activated control signals 105 would access respective one or more core arrays 120 (120a-p) (i.e., the respective 16-bit modules) for read operation.

Referring to FIG. 2C, a circuit implementation (circuit 290) for the one or more control signals 105 (sense amplifier enable signal(s) (NSAE)) (e.g., 105(a-h) for the "top" signals (e.g., for core arrays 120a-h on the "left" side of FIG. 1) is shown. In certain instances, the circuit 290 (i.e., a first read mask circuit schematic) may be provided in the control block 110. As illustrated, the circuit 290 may include a NAND gate 292 that receives an initialization input signal (netsa) and a bit read enable mask (e.g., REN[7:0]) to specify the particular column grouping to be activated. The output of the NAND gate 292 would provide the sense amplifier signal(s) (e.g., sae [7:0]) that can be inverted through the inverter 294 to provide the one or more controls signals 105 (e.g., nsae_top[7:0]). Similarly, another circuit implementation (not shown) would be present in the control block 110 for the one or more control signals 105 (sense amplifier enable signal(s) (NSAE)) (e.g., 105(i-p) for the "bottom" signals (e.g., for core arrays 120i-120p on the "right" side of FIG. 1)).

Figure 3:
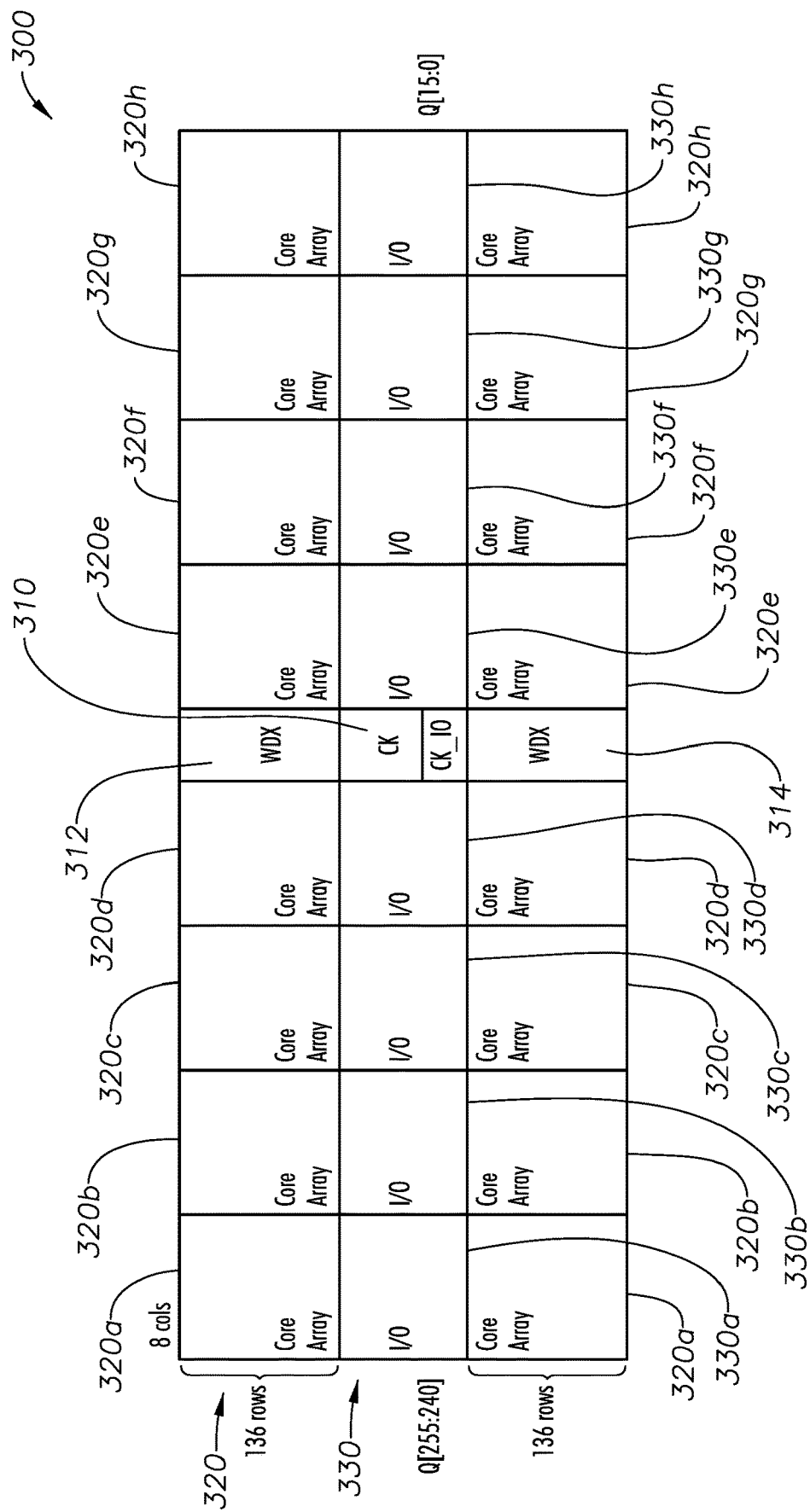
FIG. 3 is a schematic diagram of a portion of an example integrated circuit in accordance with various implementations described herein.
Figure 4A:
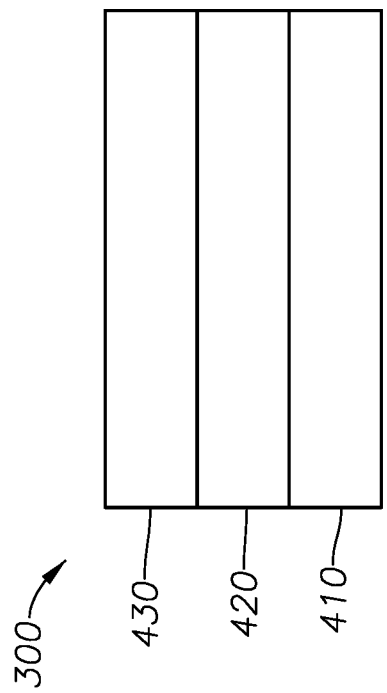
FIG. 4A is block diagram of certain layers of the example integrated circuit of FIG. 3 in accordance with various implementations described herein.
Figure 4C:
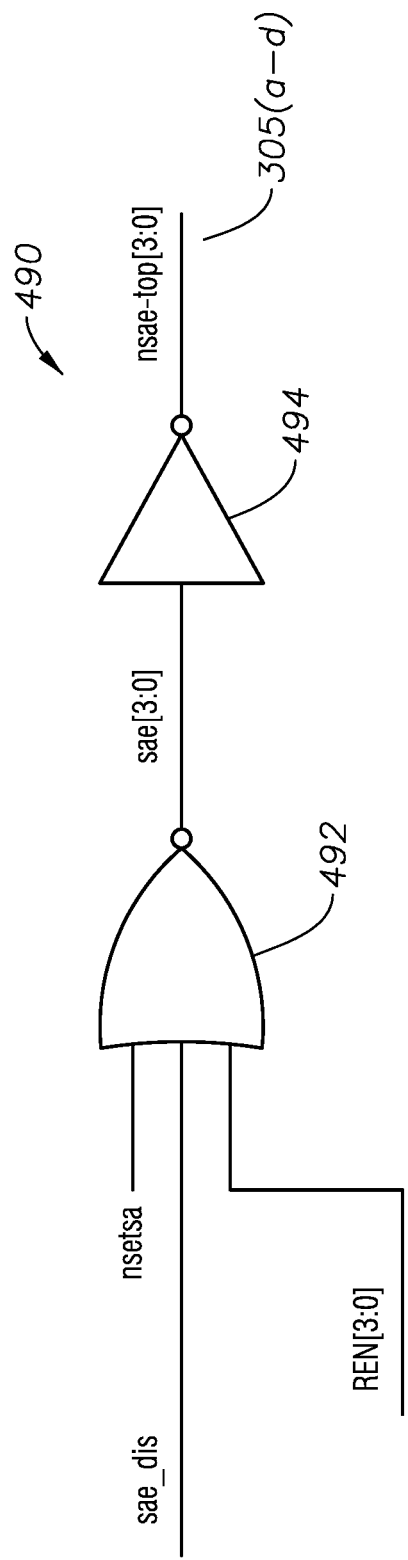
FIG. 4C is a schematic diagram of a circuit in accordance with various implementations described herein.
Figure 4B:
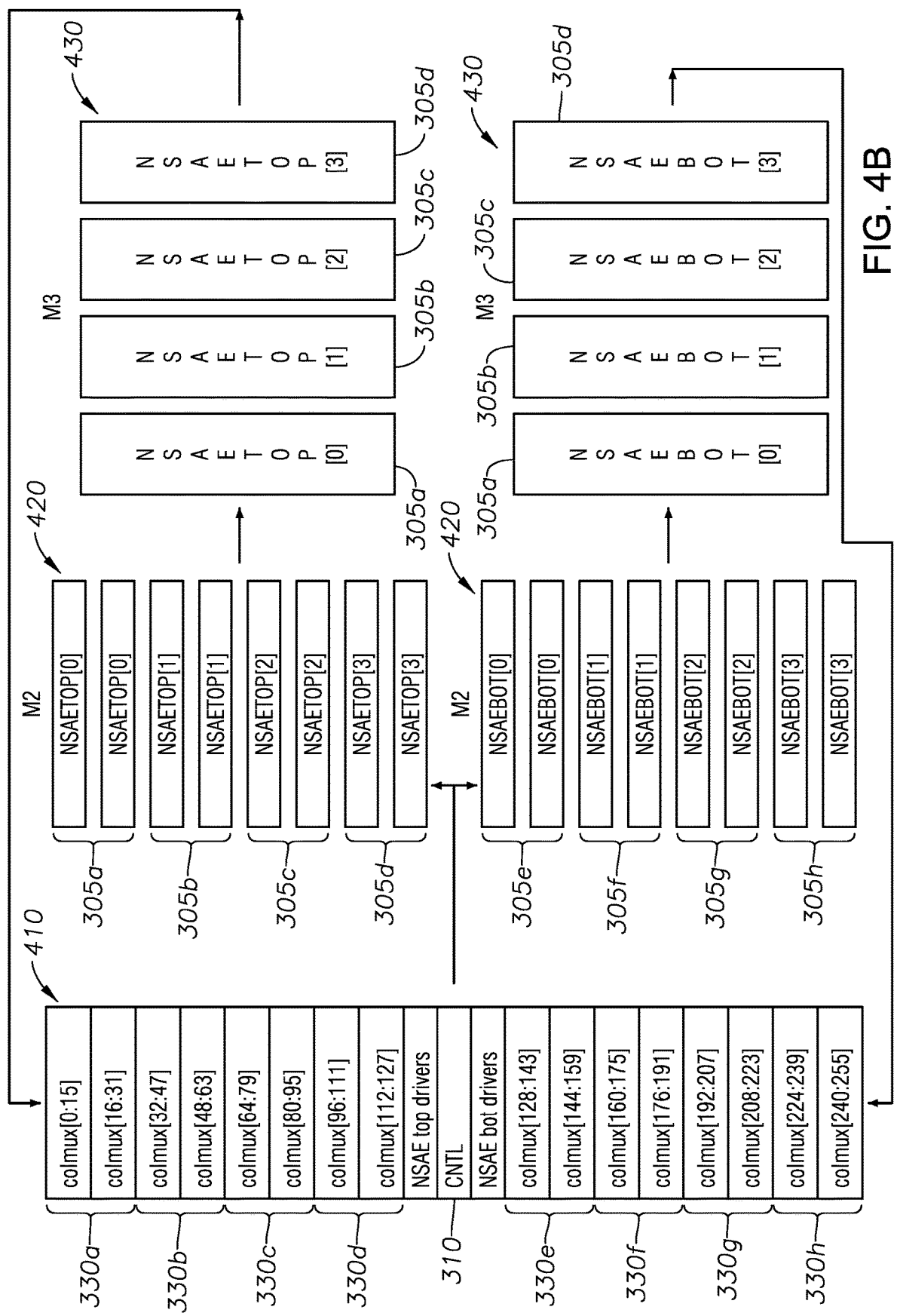
FIG. 4B is a detailed block diagram of the layers of FIG. 3A in accordance with various implementations described herein.

Referring to FIGS. 3 and 4A-4B, example portions of an integrated circuit 300 (e.g., a Turse Execution-Engine (EE) General Purpose Register File random access memory (EE-GPRF-RAM)), a "butterfly architecture" implementable on a system-on-chip (SoC)) are shown. As depicted in FIG. 3, the example portion (e.g., core array structure, "floor plan") may include: a control circuitry (i.e., a central block) ("CK") 310, first and second word-line decoder circuitries 312, 314, one or more core arrays 320 (e.g., 320a-320h), and respective input/output circuitry (I/O circuitry) 330 (e.g., 330a-330h). In certain implementations, the control circuitry 310 may be coupled to the first and second word-line decoder circuitries 312, 314, the one or more core arrays 320, and the respective input/output circuitries 330. Also, one or more control signals 305 (e.g., 305a-305h) (i.e., a sense amplifier driver signal(s), read mask signal(s)), activated from one or more control signals (e.g., sense amplifier enable signals NSAE)) generated in the control circuitry 310, may be configured to select one or more corresponding core arrays of the one or more core arrays 320 (e.g., 320a (e.g., for both the above 136 rows and the below 136 rows) corresponding to a first core array, 320b (e.g., for both the above 136 rows and the below 136 rows) corresponding to a second core array, etc.) (i.e., to provide independent control of each individual core array (e.g., 320a-320h) (e.g., core groupings).

As shown in FIG. 3, the example EE-GPRF-RAM memory may be of 272 memory words×256 bits (bit-cells) per row. For instance, as illustrated, the example 256 bits per row may be organized as 8 columns, where 4 columns are located on a first side (e.g., a "left" side of the control circuitry 310) and 4 columns are located on a second side (e.g., a "right" side of the control circuitry 310). Correspondingly, with reference to FIG. 3, the one or more core arrays 320 (e.g., 320a (e.g., for both the above 136 rows and the below 136 rows), 320b (e.g., for both the above 136 rows and the below 136 rows), etc.) may be organized as a first grouping of four memory columns 320a, 320b, 320c, and 320d (i.e., memory "chunks", modules, segments, a plurality of core arrays) on the first side and a second grouping of four memory columns 320e, 320f, 320g, and 320h on the second side. Hence, in this example, each of the 8 columns may include 32-bit groupings (i.e., 32-bit-cell grouping) for a total of 256 bits. Nevertheless, in other examples, where the total number of bit-cells per row is different (either a greater number or lesser number of bit-cells per row), the number of bit-cells per grouping would be different so as to evenly be organized as 8 columns.

Advantageously, in FIG. 3, the one or more control signals 305 (305a-305h) can allow for the capacity to "turn on" (i.e., activate) (e.g., enable read operation (i.e., the read-mask feature)) of 32-bit groupings at a time (i.e., in one read cycle). In contrast, in a memory device without such a read-mask feature, all 256-bits (of the row), for example of the integrated circuit 300 would be read for the same cycle, and thus, power would be "wasted" (put to inefficient use) for 232-bits (of the row). Thus, the inventive aspects allow for the capacity to read 32-bits (or multiples thereof by activating multiple control signals) in a signal operation cycle. By doing so, as realized through a memory dynamic power breakdown comparison, such read-mask features may save up to 65% of clock power utilization. Moreover, additional power savings may be realized in memory output pin power and system-on-chip (SoC) buffers and wires power.

In certain implementations, with reference to FIG. 3, each of the 8 core array groupings 320a-320h) may be coupled to respective input/output circuitry (I/O circuitry) 330 (330a-330h). Each of the I/O circuitry 330 may include sense amplifier driver circuitry, pre-charge circuitry, a column multiplexer, and input and output latches. Moreover, each of the sense amplifier driver circuitry may include a sense amplifier circuit and write driver circuitry.

In certain aspects, each of the first and second word-line decoder blocks (circuitries) 312, 314 may include a word-line post decoder and driver circuits. In a particular case, the word-line decoder blocks (circuitries) 312, 314 may be configured to select word-lines coupled to the one or more core arrays 320 (320a, 320b, etc.) based on the one or more control signals 305 (e.g., 305a-305h) generated by the control block 310.

Referring to FIG. 4A, example "layers" of the integrated circuit 300 are shown. As illustrated, the example layers are provided to depict the general positioning of the layers with respect to one another and have not been drawn to scale or to provide an accurate graphical representation of the particular layers. Correspondingly, in FIG. 4A, the example layers include a layout configuration layer 410 (i.e., a column multiplexer layer), a first metal layer 420 (e.g., an M2 metal layer), and a second metal layer 430 (e.g., an M3 metal layer). In certain implementations, the first metal layer 420 may be coupled and positioned above the layout configuration layer 410, and the second metal layer 430 may be coupled and positioned above the first metal layer 420.

Referring to FIG. 4B, each of the three layers 410, 420, 430 of the integrated circuit 300 of FIG. 4A is shown in greater detail. As illustrated, with reference to FIG. 3, the example layers may be provided to generally depict the specific one or more control signals 305 (e.g., 305a-305h) of the one or more control signals (i.e., sense amplifier enable signals (NSAE)) that can be activated. In this instance, up to 8 control signals (i.e., 8 NSAE signals) 305 (305a-305h) can be activated at a given time (in one cycle) to control respective core arrays 320 (320a-320h) (i.e., 32-bit modules (groupings, segments)) (where, for example, each 32-bit module includes 32-bitcells).

In operation, as illustrated with reference to FIG. 4B, initially, the control circuitry (CK) 310 may transmit the control signals 105 (105a-105h). The control signals 105 (105a-105h) would be sent from the control block 110 on the layout configuration layer 410, "up" through the first metal layer 420, and further "up: to the second metal layer 430. Subsequently, the control signals 105 ((105a-105h) would be sent "down" from the second metal layer 430, through the first metal layer 420, and received to a particular I/O circuitry 330 (e.g., 330a-130h) corresponding to the specific bit-cell grouping (e.g., 320a-320h) to be activated.

As illustrated in FIG. 4B, the first metal layer 420 (e.g., the M2 layer) and the second metal layer 430 may each receive 4 control signals 305 (i.e., 305a-305d) (e.g., two instances each of NSAETOP[0] to NSAETOP[3] and 4 control signals 305 (i.e., 305e-305h) (e.g., two instances each of NSAEBOT[0] to NSAEBOT[3] from the control circuit 310 to be transmitted to respective column multiplexers ([0:15], [16:31], [32:47], [16:31], [48:63], [64:79], [80:95], [96:111], [112:127], [128:143], [144:159], [160:175], [176:191], [192:207], [208:223], [224:239], and [240:255]) of respective I/O circuitries 330 (330a-h). Next, from the respective I/O circuitries 330, the one or more activated control signals 305 would access respective one or more core arrays 320 (320a-h) (i.e., the respective 32-bit modules) for read operation.

Referring to FIG. 4C, a circuit implementation (circuit 490) for the example one or more control signals 305 (i.e., sense amplifier enable signal (NSAE)) (e.g., 305(*a-h*) for the "top" signals (e.g., for core arrays 320a-d on the "left" side of FIG. 3) is shown. In certain instances, the circuit 490 (i.e., a first read mask circuit schematic) may be provided in the control block 310. As illustrated, the circuit 490 may include a NAND gate 492 that receives an initialization input signal (netsa) and a bit read enable mask (e.g., REN[3:0]) to specify the particular column grouping to be activated. The output of the NAND gate 492 would provide the sense amplifier signal(s) (e.g., sae [3:0]) that can be inverted through the inverter 494 to provide the one or more controls signals 305 (i.e., 305 *a-d*) (e.g., nsae_top [3:0]). Similarly, another circuit implementation (not shown) would be present in the control block 310 for the one or more control signals 305 (sense amplifier enable signal(s) (NSAE)) (e.g., 305(*e-h*) for the "bottom" signals (e.g., for core arrays 320e-320h on the "right" side of FIG. 3)).

Figure 5:
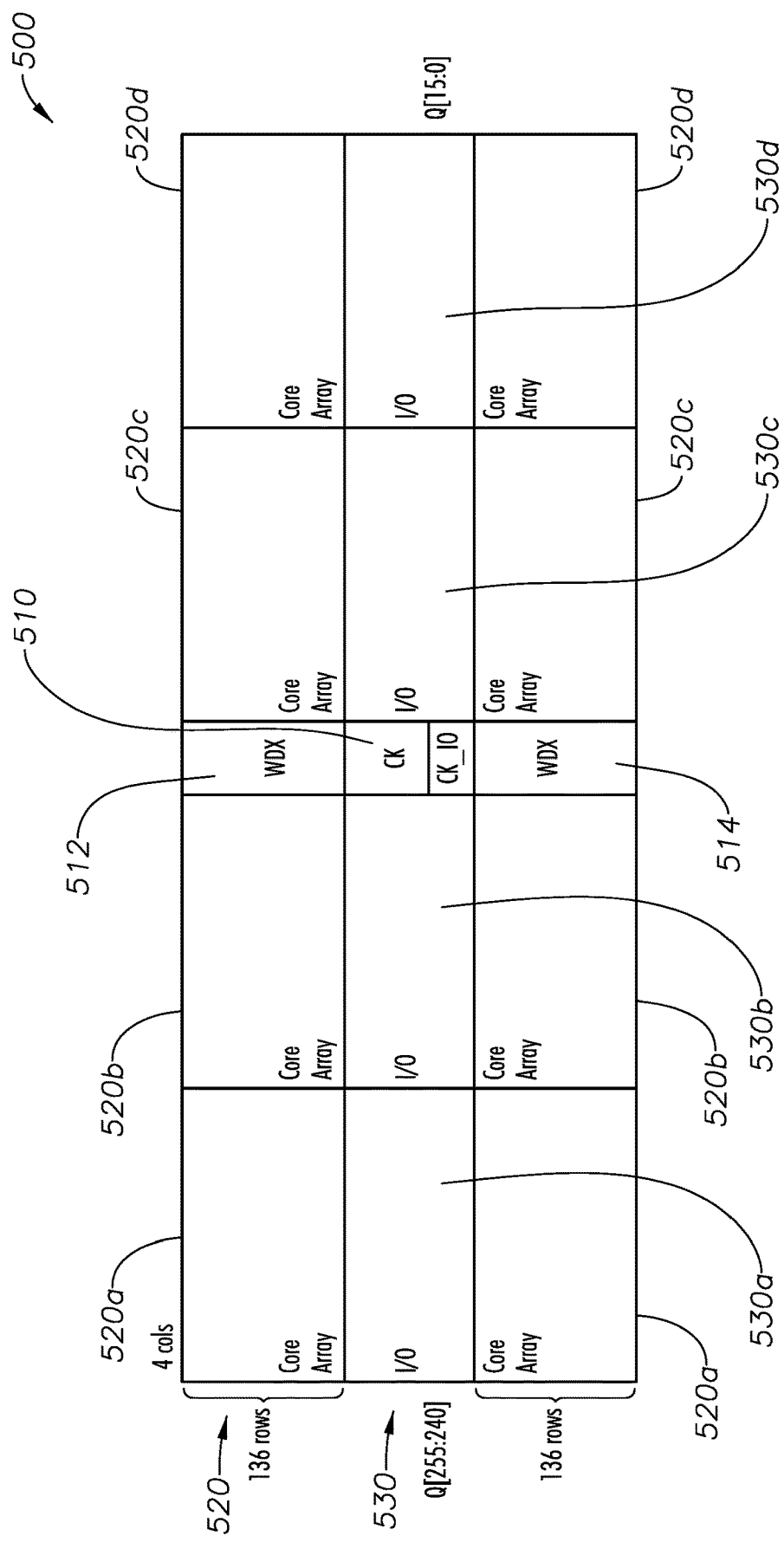
FIG. 5 is a schematic diagram of a portion of an example integrated circuit in accordance with various implementations described herein.
Figure 6A:
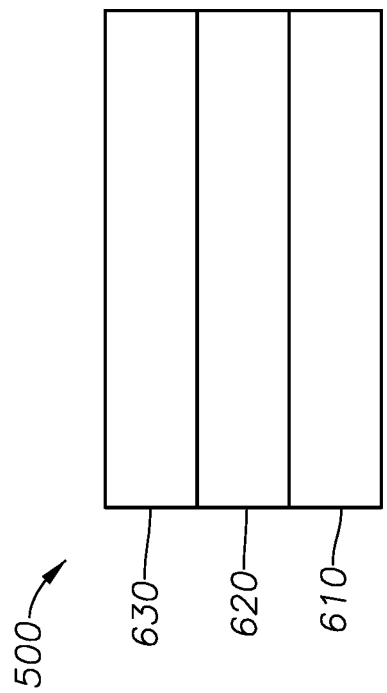
FIG. 6A is block diagram of certain layers of the example integrated circuit of FIG. 5 in accordance with various implementations described herein.
Figure 6C:
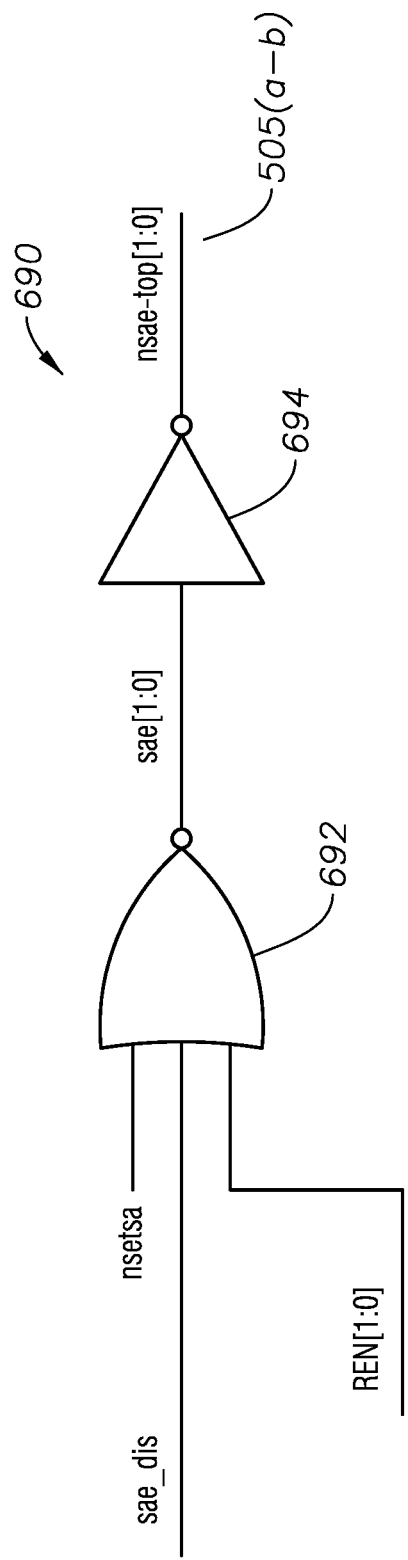
FIG. 6C is a schematic diagram of a circuit in accordance with various implementations described herein.
Figure 6B:
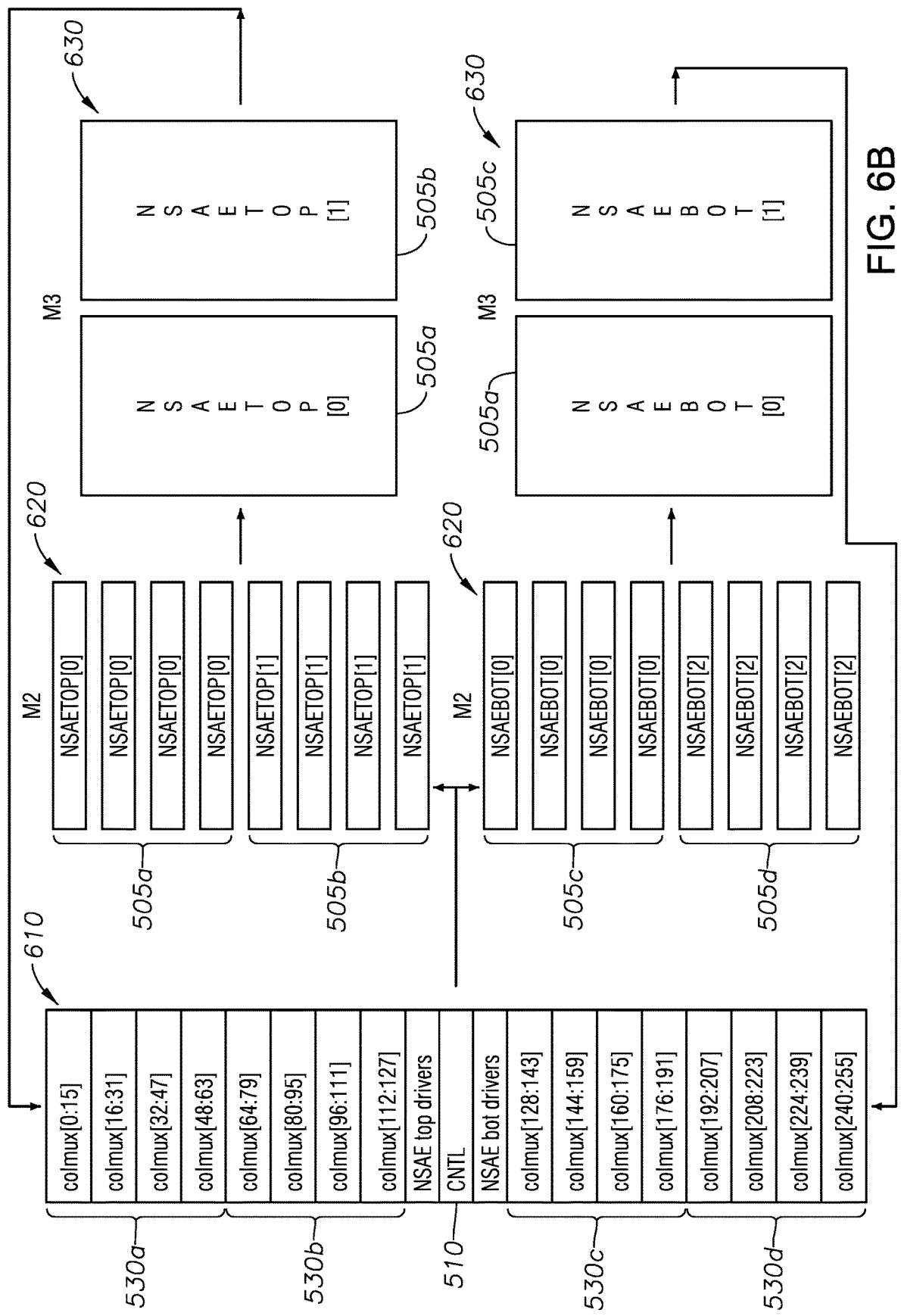
FIG. 6B is a detailed block diagram of the layers of FIG. 6A in accordance with various implementations described herein.

Referring to FIGS. 5 and 6A-6B, example portions of an integrated circuit 500 (e.g., a Turse Execution-Engine (EE) General Purpose Register File random access memory (EE-GPRF-RAM), a "butterfly architecture" implementable on a system-on-chip (SoC)) are shown. As depicted in FIG. 5, the integrated circuit 500 may include a core array structure comprising: a control circuitry (i.e., a central block) ("CK") 510, first and second word-line decoder circuitries 512, 514, one or more core arrays 520 (e.g., 520a to 520d), and respective input/output circuitry (I/O circuitry) 530 (e.g., 530a to 530d). In certain implementations, the control circuitry 510 may be coupled to the first and second word-line decoder circuitries 512, 514, the one or more core arrays 520, and the respective input/output circuitries 530. Also, one or more control signals 505 (e.g., 505a-505d) (i.e., a sense amplifier driver signal(s), read mask signal(s)), activated from one or more control signals (e.g., sense amplifier enable signals NSAE)) generated in the control circuitry 510, may be configured to select one or more corresponding core arrays of the one or more core arrays 520 (e.g., 520a (e.g., for both the above 136 rows and the below 136 rows) corresponding to a first core array, 520b (e.g., for both the above 136 rows and the below 136 rows) corresponding to a second core array, etc.) (i.e., to provide independent control of each individual core array (e.g., 520a to 520d) (e.g., core groupings).

As shown in FIG. 5, the example EE-GPRF-RAM memory may be of 272 memory words×256 bits (bit-cells) per row. For instance, as illustrated, the example 256 bits per row may be organized as 4 columns, where 2 columns are located on a first side (e.g., as shown as a "left" side of the control circuitry 510) and 4 columns are located on a second side (e.g., as shown as a "right" side of the control circuitry 510). Correspondingly, with reference to FIG. 5, the one or more core arrays 520 (e.g., 520a (e.g., for both the above 136 rows and the below 136 rows), 520b (e.g., for both the above 136 rows and the below 136 rows), etc.) may be organized as a first grouping of two memory columns 520a and 520b (i.e., memory "chunks", modules, segments, a plurality of core arrays) on the first side and a second grouping of two memory columns 520c and 520d on the second side. Hence, in this example, each of the 4 columns may include 64-bit groupings (i.e., 64-bit-cell grouping) for a total of 256 bits. Nevertheless, in other examples, where the total number of bit-cells per row is different (either a greater number or lesser number of bit-cells per row), the number of bit-cells per grouping would be different so as to evenly be organized as 4 columns.

Advantageously, in FIG. 5, the one or more control signals 505 (505a-505d) can allow for the capacity to "turn on" (i.e., activate) (e.g., enable read operation (i.e., the read-mask feature)) of 64-bit groupings at a time (i.e., in one read cycle). In contrast, in a memory device without such a read-mask feature, all 256-bits (of the row), for example of the integrated circuit 500 would be read for the same cycle, and thus, power would be "wasted" (put to inefficient use) for 192-bits of the row. Thus, the inventive aspects allow for the capacity to read 64-bits (or multiples thereof by activating multiple control signals) in a signal operation cycle. By doing so, as realized through a memory dynamic power breakdown comparison, such read-mask features may save up to 65% of clock power utilization. Moreover, additional power savings may be realized in memory output pin power and system-on-chip (SoC) buffers and wires power.

In certain implementations, with reference to FIG. 5, each of the 4 core array groupings 520a-520d may be coupled to respective input/output circuitry (I/O circuitry) 530 (530a-530d). Each of the I/O circuitry 530 may include sense amplifier driver circuitry, pre-charge circuitry, a column multiplexer, and input and output latches. Moreover, each of the sense amplifier driver circuitry may include a sense amplifier circuit and write driver circuitry.

In certain aspects, each of the first and second word-line decoder blocks (circuitries) 512, 514 may include a word-line post decoder and driver circuits. In a particular case, the word-line decoder blocks (circuitries) 512, 514 may be configured to select word-lines coupled to the one or more core arrays 520 (520a to 520d) based on the one or more control signals 505 (e.g., 505a-505d) generated by the control block 510.

Referring to FIG. 6A, example "layers" of the integrated circuit 500 are shown. As illustrated, the example layers are provided to depict the general positioning of the layers with respect to one another and have not been drawn to scale or to provide an accurate graphical representation of the particular layers. Correspondingly, in FIG. 6A, the example layers include a layout configuration layer 610 (i.e., a column multiplexer layer), a first metal layer 620 (e.g., an M2 metal layer), and a second metal layer 630 (e.g., an M3 metal layer). In certain implementations, the first metal layer 620 may be coupled and positioned above the layout configuration layer 610, and the second metal layer 630 may be coupled and positioned above the first metal layer 620.

Referring to FIG. 6B, each of the three layers 610, 620, 630 of the integrated circuit 300 of FIG. 6A is shown in greater detail. As illustrated, with reference to FIG. 6B, the example layers can be provided to generally depict the specific one or more control signals 505 (e.g., 505a-505d) of the one or more control signals (i.e., sense amplifier enable signals (NSAE)) that can be activated. In this instance, up to 4 control signals (i.e., 4 NSAE signals) 505 (505a-505d) can be activated at a given time (in one cycle) to control respective core arrays 520 (520a-520d) (i.e., 64-bit modules (groupings, segments)) (where, for example, each 64-bit module includes 64-bitcells).

In operation, as illustrated with reference to FIG. 6B, initially, the control circuitry (CK) 610 may transmit the control signals 605 (605a-605d). The control signals 605 (605a-605d) would be sent from the control block 510 on layout configuration layer 610, up through the first metal layer 620, and further up to the second metal layer 630. Subsequently, the control signals 605 (605a-605d) would be sent back down from the second metal layer 630, through the first metal layer 620, and received to a particular I/O circuitry 530 (e.g., 530a-530d) corresponding to the specific bit-cell grouping (e.g., 520a-520d) to be activated.

As illustrated in FIG. 6B, the first metal layer 620 (e.g., the M2 layer) and the second metal layer 630 (e.g., M3 layer) may each receive 2 control signals 505 (i.e., 505a-505d) (e.g., two instances each of NSAETOP[0] to NSAETOP[1] and two instances each of NSAEBOT[0] to NSAEBOT[1] from the control circuit 510 to be transmitted to respective column multiplexers ([0:15], [16:31], [32:47], [16:31], [48:63], [64:79], [80:95], [96:111], [112:127], [128:143], [144:159], [160:175], [176:191], [192:207], [208:223], [224:239], and [240:255]) of respective I/O circuitries 530 (530a-530d). Next, from the respective I/O circuitries 530, the activated one or more control signals 505 would access respective one or more core arrays 520 (520a-d) (i.e., the respective 64-bit modules) for read operation.

Referring to FIG. 6C, a circuit implementation (circuit 690) for the example one or more control signals 505 (i.e., sense amplifier enable signal (NSAE)) (e.g., 505(a-b) for the "top" signals (e.g., for core arrays 520a-b on the "left" side of FIG. 5) is shown. In certain instances, the circuit 690 (i.e., a first read mask circuit schematic) may be provided in the control block 510. As illustrated, the circuit 690 may include a NAND gate 692 that receives an initialization input signal (netsa) and a bit read enable mask (e.g., REN[1:0]) to specify the particular column grouping to be activated. The output of the NAND gate 692 would provide the sense amplifier signal(s) (e.g., sae [1:0]) that can be inverted through the inverter 694 to provide the one or more controls signals 505 (e.g., nsae_top [1:0]). Similarly, another circuit implementation (not shown) would be present in the control block 510 for the one or more control signals 505 (sense amplifier enable signal(s) (NSAE)) (e.g., 505(c-d) for the "bottom" signals (e.g., for core arrays 320c-320d on the "right" side of FIG. 5)).

Figure 7:
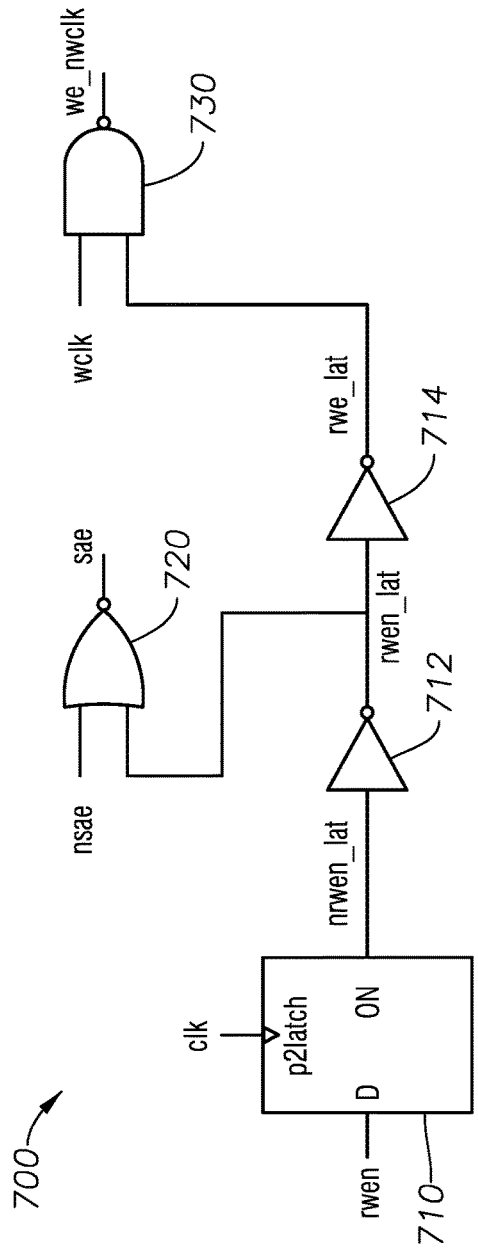
FIG. 7 is a schematic diagram of a circuit in accordance with various implementations described herein.

Referring to FIG. 7, a circuit 700 (i.e., a first alternative second read mask circuit schematic) is shown. The circuit 700 may be implemented either concurrently or independently of the circuit 290, 490, 690 (as implemented within the example control blocks 110, 310, and 510 to generate and activate control signals 105, 305, and 505). In certain implementations, with reference to FIGS. 1, 3, and 5, the circuit 700 may be coupled within each column multiplexer of the I/O circuitry (130, 330, 530). Advantageously, the circuit 700 can allow for more flexible usage to divide the bits into variable number of segments. For instance, the circuit 700 allows for specific selection of one or more bitcells within the corresponding activated core arrays. Hence, independent control of each particular bit-cell in a particular core array grouping may be realized. Additionally, the implementation of the circuit 700 may be performed by a circuit designer without additional changes to the respective sense amplifier driver circuitry.

As illustrated, the circuit 700 may include a read/write enable (rwen) latch 710, first and second inverters 712, 714, a NOR gate 720, and a NAND gate 730. In one operation, a read-write enable (rwen) bit (signal) may be input into the latch 710 whose output may be inverted and input along with one or more control signals (nsae) to the NOR gate 720 to generate a sense amplifier enable signal (sae). Also, the output of the latch 710 would also be inverted and input along with a write enable clock (wclk) to a NAND gate 730 to generate a write driver signal (we_nwclkc). Correspondingly, a rwen bit (e.g., rwen[n−1:0]) may be utilized to control both the sense amplifier enable (SAE) signal and the write driver signal. For instance, when the write enable is "active-low", a digital "1" would be on the input, the rwen latch 710 would be a "1", and thus, the sense amplifier would be "clamped" to "low", and the write clock would be clamped to "1". Accordingly, in doing so, read and write operations can be disabled. In certain aspects, during write cycles, the circuit 700 may perform bit write-masks and during read cycles, the circuit 700 may perform bit-read masks. Moreover, bit-write masks inputs and latches may also be reused.

In one instance, when the circuit 700 (or circuits 800, and the combination of circuits 900, 950 as discussed in below paragraphs) may be implemented concurrently with the circuit 290 (or circuits 490, 690) in an example integrated circuit (e.g., integrated circuits 100, 300, 500), the activation of the one or more control signals would occur from the control block circuitry (e.g., control block circuitry 110, 310, 510). In such an instance, the control logic for the integrated circuit would be the same as that of without the circuit 700, however, the number of activated control signals (i.e., NSAE control signals) be different.

In another instance, (or circuits 800, and the combination of circuits 900, 950 as discussed in below paragraphs) when the circuit 700 may be implemented with an example integrated circuit (e.g., integrated circuits 100, 300, and 500) and without the circuit 290 (or circuits 490, 690) in the control block circuitry (e.g., respective control block circuitries 110, 310, and 510), there would be a single activation signal (i.e., one NSAE control signal) that would be controlled by the RWEN inputs in each I/O circuitry (e.g., I/O circuitry 130, 330, 530). Hence, in such an instance, each of I/O circuitry would individually control selection and read operations for the integrated circuit.

Figure 8:
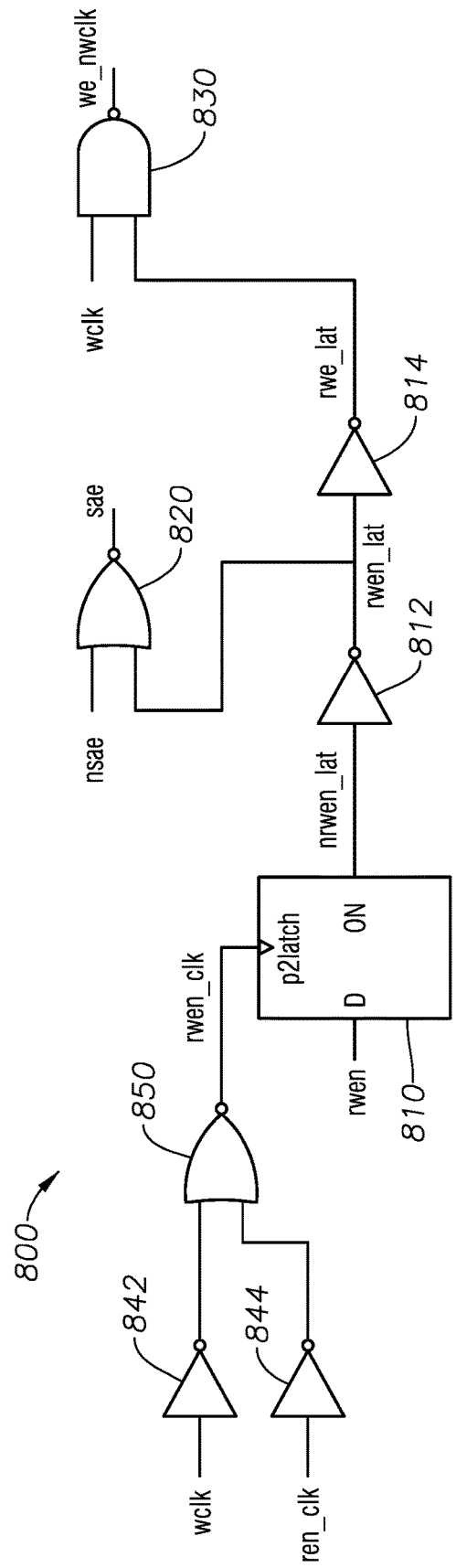
FIG. 8 is a schematic diagram of a circuit in accordance with various implementations described herein.

Referring to FIG. 8, a circuit 800 is shown as a second alternative to the second read mask circuit schematic (of FIG. 7). As illustrated, the circuit 800 includes a variation of the circuit 700 that may alternatively be implemented either concurrently or independently of the circuit 290, 490, 690 (as implemented within an example control blocks (e.g., control block 110, 310, and 510) to generate and activate one or more control signals (e.g., control signals 105, 305, and 505). In certain implementations, with reference to FIGS. 1, 3, and 5, the circuit 800 may be coupled within each column multiplexer of the I/O circuitry (130, 330, 530). Advantageously, the circuit 800 can allow for more flexible usage to divide the bits into variable number of segments. For instance, the circuit 800 can allow for specific selection of one or more bit-cells within the corresponding activated core arrays (120, 320, 520). Hence, independent control of each particular bit-cell in a particular core array grouping may be realized. Additionally, the implementation of the circuit 800 may be performed by a circuit designer without additional changes to the respective sense amplifier driver circuitry.

As illustrated, similar to circuit 700, the circuit 800 may include a read/write enable (rwen) latch 810, first and second inverters 812, 814, a NOR gate 820, and a NAND gate 830. In contrast, the circuit 800 may additionally include a write clock (wclk) and a read enable clock (ren_clk) input into third and fourth inverters 842, 844, from which the output would be input to a second NAND gate 850. The output of the NAND gate 850 would be input to the rwen latch 810. Advantageously, the circuit 800 provide for a locally generated clock (rwen_clk) for the rwen latch 810 that would improve internal race margin.

Figure 9A:
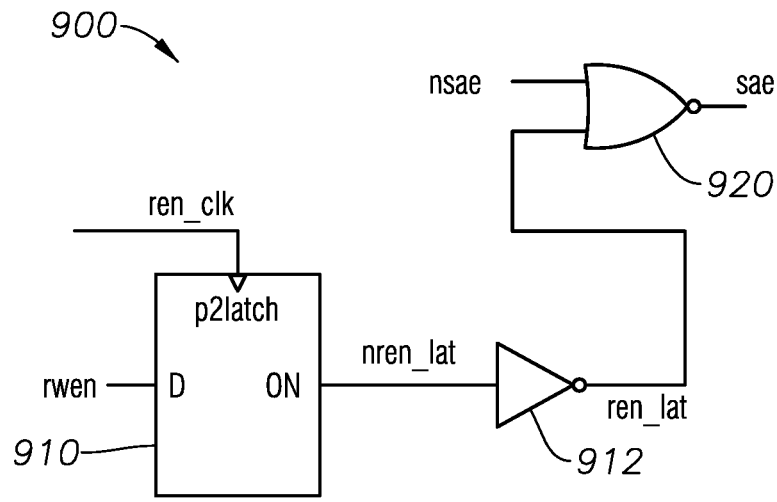
FIGS. 9A-9B are schematic diagrams of circuits in accordance with various implementations described herein.
Figure 9B:
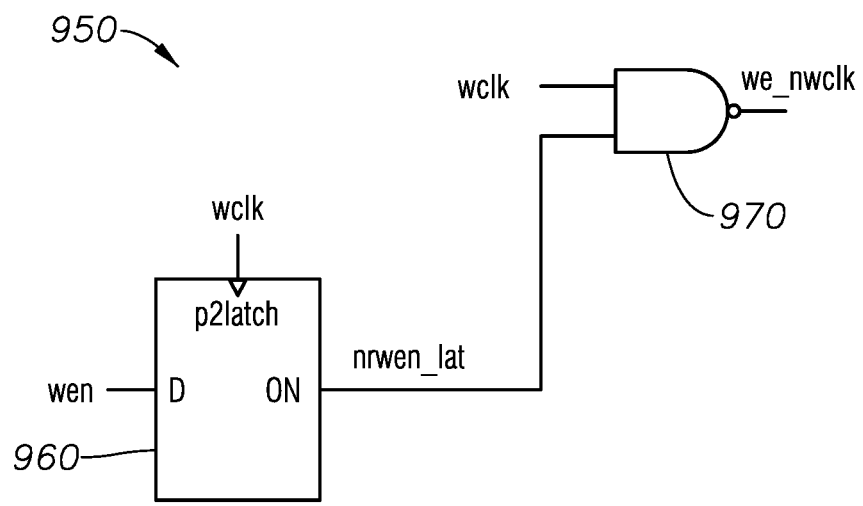

Referring to FIGS. 9A-9B, two circuit implementations 900, 950 are shown as a third alternative to the second read mask circuit schematic (of FIG. 7). Advantageously, the circuits 900 and 950 illustrate a separate read bit enable latch (900) and a separate write enable latch (950). Similar to FIGS. 7 and 8, the two circuit implementations 900 (in FIG. 9A) and 950 (in FIG. 9B) together can be variation of the circuit 700 that may alternatively be implemented concurrently or independently of the circuit 290, 490, 690 (as implemented within an example control block (e.g., control block 110, 310, and 510) to generate and activate one or more control signals (e.g., control signals 105, 305, and 505). In certain implementations, with reference to FIGS. 1, 3, and 5, the circuits 900, 950, in combination, may be coupled within each column multiplexer of the I/O circuitry (130, 330, 530). Advantageously, the circuits 900, 950, in combination, can allow for more flexible usage to divide the bits into variable number of segments. For instance, the circuits 900, 950 allow for specific selection of one or more bit-cells within the corresponding activated core arrays. Hence, independent control of each particular bit-cell in a particular core array grouping may be realized. Additionally, the implementation of the circuit 900, 950 may be performed by a circuit designer without additional changes to the respective sense amplifier driver circuitry.

The circuit 900 may include a read enable latch 910, an inverter 912, and a NAND gate 920. In operation, in circuit 900, a sense enable signal (SAE) may be generated from read enable bit, a read enable clock, and one or more controls signals (NSAE). The circuit 950 may include a write enable latch 960, an inverter 912, and a NAND gate 970. In operation, in circuit 950, a write driver signal (we_nwclkc) may be generated from a write enable bit (wen) and a write enable clock (wclk).

In other schemes and techniques of the inventive aspects as described in FIGS. 1-9, other circuit implementations are also envisioned. Also, the inventive aspects may use a combination of this integrated circuits along with various standard macros to reduce power, performance, area (PPA) constraints.

According to one implementation of the present disclosure, an integrated circuit includes first and second word-line decoder circuitry; one or more core arrays, respective input/output (I/O) circuitry for each of the one or more core arrays, and control circuitry coupled to the first and second word-line decoder circuitry, the one or more core arrays, and the respective I/O circuitries. Also, one or more control signals, activated from one or more control signals generated in the control circuitry, may be configured to select corresponding one or more core arrays of the one or more core arrays.

According to one implementation of the present disclosure, an integrated circuit includes first and second word-line decoder circuitry, one or more core arrays coupled to each of the first and second word-line decoder circuitries, and respective input/output (I/O) circuitry for each of the one or more core arrays. Also, one or more control signals, generated in one or more of the respective I/O circuitries from an activation signal transmitted from a control block circuitry, can be configured to select one or more bit-cells of the one or more core arrays.

In example implementations, certain circuit elements have been provided in FIGS. 1-9B, whose redundant description has not been duplicated in the related description of analogous circuit elements herein. It is expressly incorporated that the same circuit elements with identical symbols and/or reference numerals are included in each of embodiments based on its corresponding figure(s).

Although one or more of FIGS. 1-9B may illustrate systems or apparatuses according to the teachings of the disclosure, the disclosure is not limited to these illustrated systems or apparatuses. One or more functions or components of any of FIGS. 1-9B as illustrated or described herein may be combined with one or more other portions of another of FIGS. 1-9B. Accordingly, no single implementation described herein should be construed as limiting and implementations of the disclosure may be suitably combined without departing form the teachings of the disclosure.

The block diagrams in the Figures illustrate the architecture, functionality, and operation of possible implementations of systems and methods according to various implementations of the present disclosure. In this regard, each block in the block diagrams may represent a module, segment, or portion of instructions, which comprises one or more executable instructions for implementing the specified logical function(s). In some alternative implementations, the functions noted in a block in a diagram may occur out of the order noted in the figures. For example, two blocks shown in succession may be executed substantially concurrently, or the blocks may sometimes be executed in the reverse order, depending upon the functionality involved. It will also be noted that each block of the block diagrams, and combinations of blocks in the block diagrams, can be implemented by special purpose hardware-based systems that perform the specified functions or acts or carry out combinations of special purpose hardware and computer instructions.

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first", "second", etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm utilized in connection with the disclosure herein may be implemented directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. An integrated circuit comprising:
   first and second word-line decoder circuitry;
   one or more core arrays;
   respective input/output (I/O) circuitry for each of the one or more core arrays; and
   control circuitry coupled to the first and second word-line decoder circuitry, the one or more core arrays, and the respective I/O circuitries, wherein one or more control signals, activated from one or more control signals generated in the control circuitry, are configured to select corresponding one or more bit-cells of the one or more core arrays.

2. The integrated circuit of claim 1, wherein each of the input/output circuitry comprises sense amplifier circuitry, a pre-charge circuit, a column multiplexer, and input and output latches.

3. The integrated circuit of claim 2, further comprising:
   a column multiplexer layer;
   a first metal layer; and
   a second metal layer, wherein the first metal layer is coupled and positioned above the column multiplexer layer, and wherein the second metal layer is coupled and positioned above the first metal layer.

4. The integrated circuit of claim 3, wherein the first and second metal layers are configured to transmit the one or more control signals from the control block circuitry to the input/output circuitries.

5. The integrated circuit of claim 1, wherein the one or more core arrays comprise sixteen core arrays, wherein the one or more control signals comprise sixteen corresponding control signals, and wherein each of the one or more core arrays comprises sixteen bit-cells per row.

6. The integrated circuit of claim 5, wherein the one or more control signals are configured to read up to sixteen bit-cells per row per execution cycle.

7. The integrated circuit of claim 5, wherein the one or more control signals are configured to control respective one or more core arrays of the sixteen core arrays.

8. The integrated circuit of claim 1, wherein the one or more core arrays comprise eight core arrays, wherein the one or more control signals comprise eight corresponding control signals, and wherein each of the one or more core arrays comprises thirty-two bit-cells per row.

9. The integrated circuit of claim 8, wherein the one or more control signals are configured to control respective one or more core arrays of the eight core arrays.

10. The integrated circuit of claim 8, wherein the one or more control signals are configured to read up to thirty-two bit-cells per row per execution cycle.

11. The integrated circuit of claim 1, wherein the one or more core arrays comprise four core arrays, wherein the one or more control signals comprise four corresponding control signals, and wherein each of the one or more core arrays comprises sixty-four bit-cells per row.

12. The integrated circuit of claim 11, wherein the one or more control signals are configured to control one or more core arrays of the four core arrays.

13. The integrated circuit of claim 11, wherein the one or more control signals are configured to read up to sixty-four bit-cells per row per execution cycle.

14. The integrated circuit of claim 1, wherein each of the respective I/O circuitries comprises a second control circuitry, wherein the second control circuitry is configured to generate one or more second control signals to control selection of the one or more bit-cells of the selected one or more core arrays.

15. The integrated circuit of claim 14, wherein the one or more bit-cells are non-consecutive bit-cells.

16. The integrated circuit of claim 15, wherein the second control circuitry comprises a read/write bit enable latch, wherein the output signal of the read/write bit enable latch is configured to control the respective I/O circuitry for selection of the one or more bit-cells.

17. The integrated circuit of claim 15, wherein the second control circuitry comprises first and second clock signals input into a read/write bit enable latch, wherein the output signal of the read/write bit enable latch is configured to control the respective I/O circuitry for selection of the one or more bit-cells.

18. The integrated circuit of claim 15, wherein the second control circuitry comprises first and second latches, wherein the first latch is a read enable latch and the second latch is write enable latch, wherein the output signal of the read enable latch is configured to control the respective I/O circuitry to perform a read operation of the one or more bit-cells, and wherein the output signal of the write enable latch is configured to control the respective I/O circuitry to perform a write operation of the one or more bit-cells.

19. An integrated circuit:
   first and second word-line decoder circuitry;
   one or more core arrays coupled to each of the first and second word-line decoder circuitries; and
   respective input/output (I/O) circuitry for each of the one or more core arrays, wherein one or more control signals, generated in one or more of the respective I/O circuitries from an activation signal transmitted from a control block circuitry, is configured to select one or more bit-cells of the one or more core arrays.

20. The integrated circuit of claim 19, wherein the respective I/O circuitries are configured to individually control the selection of the one or more bit-cells, and wherein the control block circuitry located apart from each of the respective I/O circuitries.

* * * * *